(12) United States Patent
Tino et al.

(10) Patent No.: US 8,781,651 B2
(45) Date of Patent: Jul. 15, 2014

(54) SYSTEMS AND METHODS PROVIDING A FUEL-EFFICIENT RTA IMPLEMENTATION WITH UNCERTAIN WINDS

(71) Applicant: Georgia Tech Research Corporation, Atlanta, GA (US)

(72) Inventors: Clayton Patrick Tino, Atlanta, GA (US); John-Paul Barrington Clarke, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/624,771

(22) Filed: Sep. 21, 2012

(65) Prior Publication Data

US 2014/0088799 A1    Mar. 27, 2014

(51) Int. Cl.
*G06F 17/00* (2006.01)
*B64C 19/00* (2006.01)

(52) U.S. Cl.
CPC ...................................... *B64C 19/00* (2013.01)
USPC ............................................................ 701/3

(58) Field of Classification Search
USPC ............................................................ 701/3
See application file for complete search history.

(56) References Cited

U.S. PATENT DOCUMENTS

2010/0152931 A1\*  6/2010  Lacombe et al. .................. 701/8
2010/0271239 A1\* 10/2010  Kolcarek et al. .............. 340/971

\* cited by examiner

*Primary Examiner* — Mary Cheung
*Assistant Examiner* — Anne Mazzara
(74) *Attorney, Agent, or Firm* — Troutman Sanders LLP; Ryan A. Schneider; Jay R. Anderson

(57) ABSTRACT

Flight management systems and control methods for meeting a required time of arrival (RTA) with reduced fuel burn. The method can account for probabilistic wind forecast uncertainty in RTA calculations by reformulating the speed and thrust profile problem as a multi-stage stochastic program, using a wind forecast uncertainty model to generate scenario sets for the fuel optimization problem. The method can iteratively calculate a fuel-efficient advised air speed for achieving an RTA over a flight path with an arbitrary number of recourse points.

Methods for creating wind forecast uncertainty models applicable to a variety of routes through a given airspace, and for use with the flight management systems and control methods. An example wind forecast uncertainty model can be position-specific, data-driven and based on a Markov chain representing error values between historical wind speed data and forecasted wind speed data long a planned flight route or between an origin-destination pair.

20 Claims, 10 Drawing Sheets

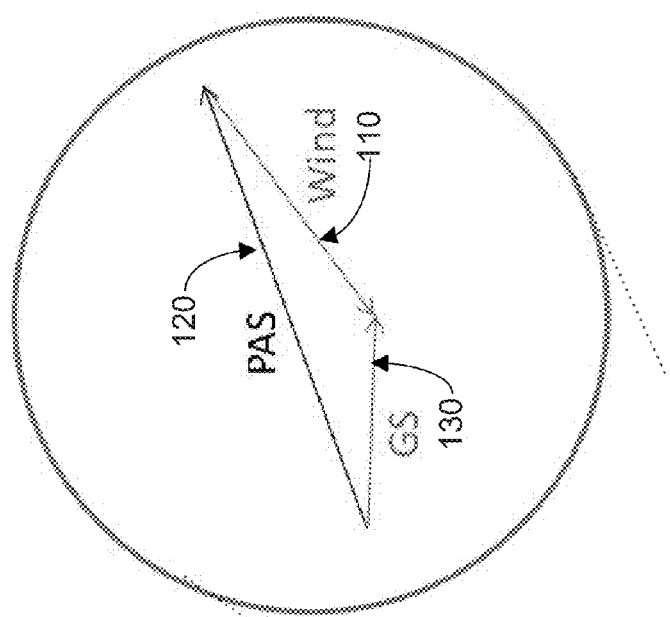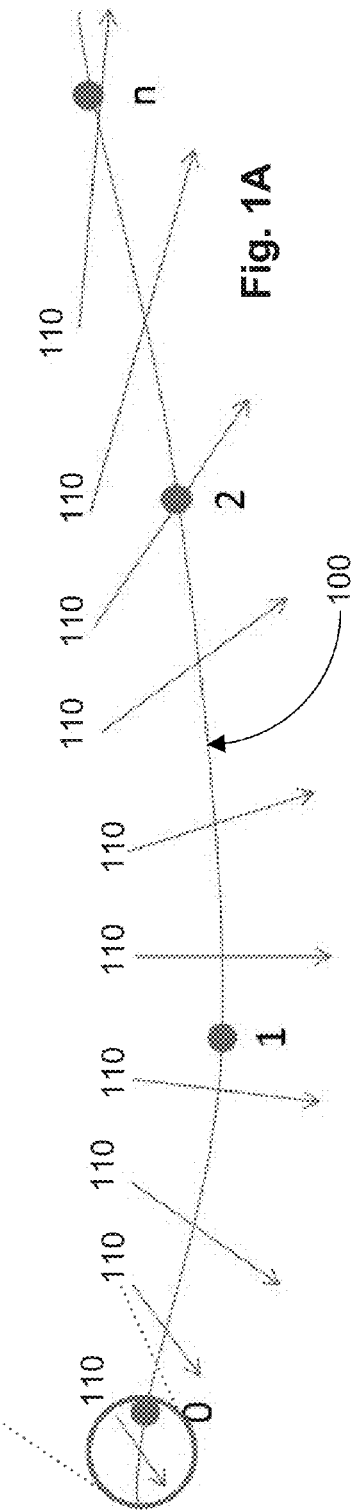

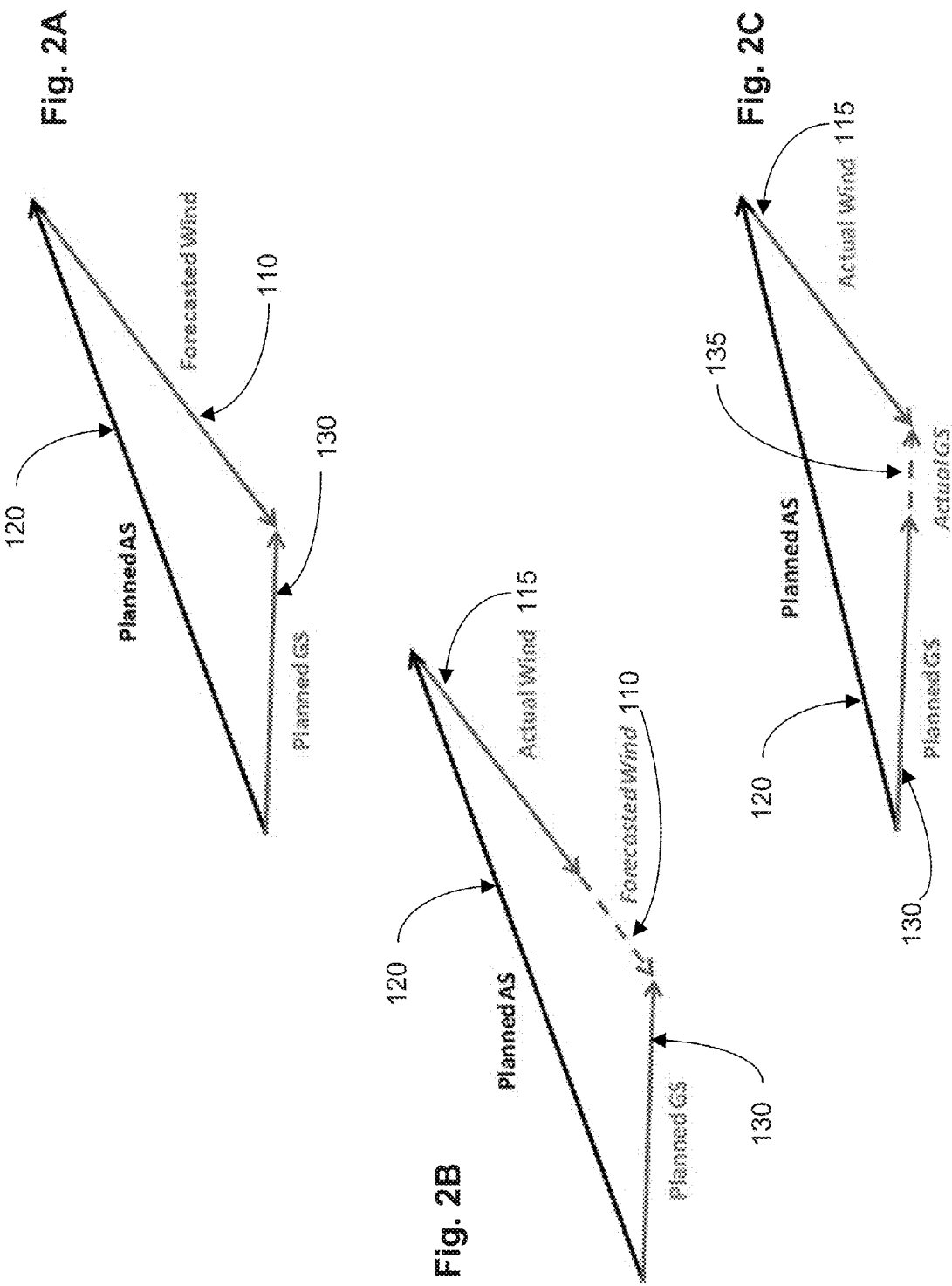

Fig. 8A
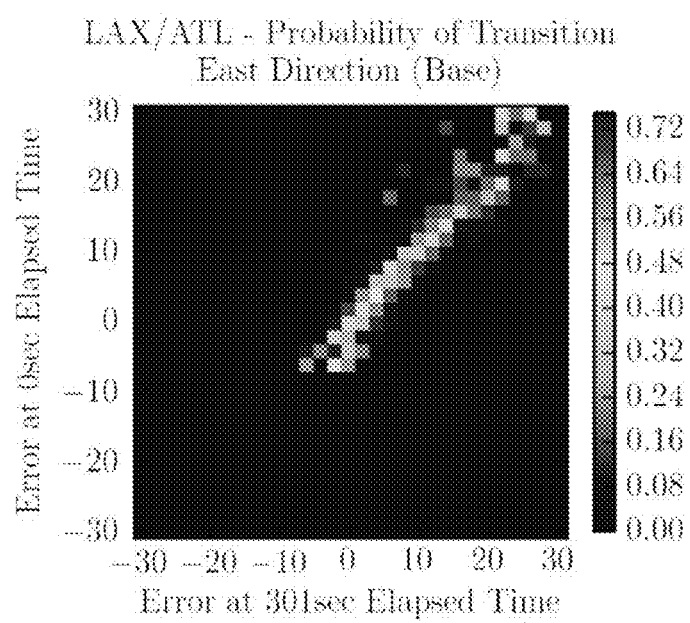
(a) True-East direction.
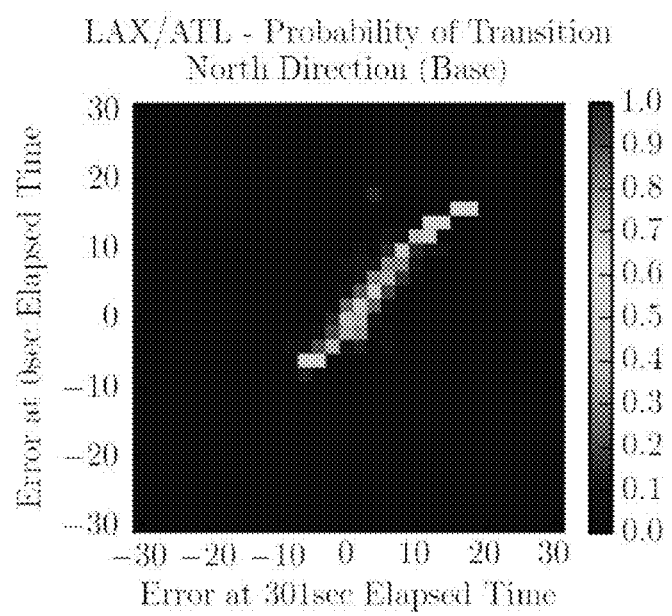
(b) True-North direction.
Fig. 8B

US 8,781,651 B2

SYSTEMS AND METHODS PROVIDING A FUEL-EFFICIENT RTA IMPLEMENTATION WITH UNCERTAIN WINDS

BACKGROUND

1. Technical Field

Various implementations of the disclosed technology relate to flight management systems and control methods and, more particularly, flight management systems and control methods for meeting a required time of arrival with reduced fuel burn. Various implementations of the disclosed technology also relate to systems and methods for modeling wind forecast uncertainty.

2. Description of Related Art

Projected increased traffic loads in the national airspace as well as growing operational inefficiencies have motivated the development of trajectory based operations (TBO), specifically 4-D trajectories (4DT). The inclusion of 4DT-based technologies is meant to mitigate the impact of increased traffic loads on delays, cost of operation, and the environment by improving both an aircraft's ability to meet schedule constraints mid-flight, as well as the ground's ability to foresee and adjust to operational uncertainties.

Current aircraft systems enable 4DT and TBO via the Required Time of Arrival (RTA) mode in the on-board flight management system (FMS). The FMS calculates the control authority required to meet an assigned RTA by considering the distance to the RTA fix, the performance capabilities of the aircraft, and the forecasted wind along the aircraft's route. However, real world uncertainties in the forecasted wind speeds can lead to errors in time-to-fix calculations as forecast error aggregates over the course of the flight. In many cases, flight time prediction accuracy only improves to an acceptable level once the RTA fix is relatively close. By this point, excessive control effort beyond the aircraft's performance capabilities may be required to meet the assigned RTA, leading to increased fuel burn, emissions, and missed RTA assignments.

Conventional FMS RTA technologies lack robustness in two primary areas of operation: fuel expenditure required to meet an assigned RTA, and the ability to calculate a workable control schedule to meet an assigned RTA given known conditions. Both of these shortcomings can be attributed in large part to wind forecast uncertainty along the aircraft's planned route. Conventional FMS RTA technologies typically consider only a deterministic wind speed forecast. As these conventional technologies are unable to account for uncertainty in the forecasted wind speeds, a conventional FMS cannot consider all possible scenarios, including wind scenarios more favorable to the aircraft, in which an FMS can meet an assigned RTA.

SUMMARY

There is a need for flight management systems and control methods providing improved conformity to an assigned required time of arrival constraint while reducing required fuel burn.

There is a further need for flight management systems and control methods that account for probabilistic wind forecast uncertainty in required time of arrival calculations.

There is yet a further need for such flight management systems and control methods capable of reformulating the speed and thrust profile problem as a multi-stage stochastic program.

There is also a need for robust wind forecast uncertainty models applicable to a wide variety of flight routes through a given airspace.

There is a further need for position-specific forecast uncertainty models suitable for generating forecast uncertainty terms based on an aircraft's geographic position.

There is yet a further need for data-driven forecast uncertainty models providing an improved correlation structure.

According to an example implementation of the disclosed technology, a method for calculating an advised travel speed providing improved conformity to a target time of arrival with reduced fuel burn is provided. The method can include receiving a travel plan including a travel route and a required time of arrival at a last or final waypoint. The method can also include dividing the travel route into at least two discreet segments based on one or more recourse waypoints including a first segment and a last segment. The first segment can be from a starting waypoint of the travel route to a first recourse waypoint and the last segment can be from a last recourse waypoint to the final waypoint. The method can also include selecting a first segment nominal travel speed required to meet the RTA at the last waypoint based on nominal forecasted interference factors. The first segment nominal travel speed can be associated with a nominal expected fuel burn over the travel route. The method can also include iteratively calculating, with a computer processor, a first segment advised travel speed to satisfy the RTA based on the first segment nominal travel speed and probabilistic interference factors derived at least partially from one or more forecast uncertainty models. The first segment advised travel speed can be associated with an advised expected fuel burn over the travel route and the advised expected fuel burn can be less than the nominal expected fuel burn.

In a further implementation, the travel plan can be a flight plan, the travel route can be a flight path, the target time of arrival can be a required time of arrival (RTA), the first segment nominal travel speed can be a first segment nominal cruise speed, the nominal forecasted interference factors can include nominal forecasted wind speed data, the probabilistic interference factors can include historical wind speed data, the first segment advised travel speed can be a first segment advised cruise speed, and the one or more forecast uncertainty models can include a wind forecast uncertainty model.

In yet a further implementation, iteratively calculating can include calculating the nominal expected fuel burn along the flight path based on the first segment nominal cruise speed. Iteratively calculating can also include perturbing the first segment nominal cruise speed to generate two or more first segment perturbed cruise speeds, and for the two or more perturbed cruise speeds, calculating a perturbed expected fuel burn along the flight path based on the perturbed cruise speed. Iteratively calculating can also include selecting the first segment advised cruise speed associated with the advised expected fuel burn based on the first segment nominal cruise speed and the two or more perturbed cruise speeds, and the nominal expected fuel burn and the two or more perturbed expected fuel burns.

In yet another further implementation, selecting the first segment advised cruise speed associated with the advised expected fuel burn can comprise fitting an approximation or regression to the first segment nominal cruise speed and the two or more first segment perturbed cruise speeds as independent variables, and the nominal expected fuel burn and the two or more perturbed expected fuel burns as dependent variables. The approximation can be second or higher order polynomial function. For example, the approximation can be a quadratic fit. The implementation can also include selecting an approximate cruise speed associated with an approximate fuel burn that is less than the nominal expected fuel burn. The approximate fuel burn can be the minimum of the polynomial function.

In another implementation, the method can further include determining if the selected approximate cruise speed is outside of a specified range of the first segment nominal cruise speed, and if so, setting the first segment nominal cruise speed as the selected approximate cruise speed and repeating iteratively calculating.

In yet another implementation, calculating the nominal expected fuel burn can include generating wind speed scenarios for each segment of the at least two discreet segments by perturbing the nominal forecasted wind speed data for the segment based on the wind forecast uncertainty model and a nominal cruise speed for the segment. The nominal forecasted wind speed data can be perturbed based on correlated statistics from the wind forecast uncertainty model.

In a further implementation, generating wind speed scenarios for each segment can include, for each segment, dividing the segment into two or more discreet sub-segments of a predefined length based on one or more breakpoints, loading nominal forecasted wind speed data at each breakpoint based on an estimated flight time to each breakpoint based on the nominal cruise speed for the segment, sampling a forecast error distribution based on the wind forecast uncertainty model at each breakpoint, and adding the sampled forecast error term to the nominal forecasted wind speed at each breakpoint.

In yet another implementation, calculating the nominal expected fuel burn can further include, for each generated wind speed scenario for the first segment of the at least two discreet segments, calculating an arrival time at the first recourse waypoint based on the first segment wind speed scenario and the first segment nominal cruise speed, calculating a second segment nominal cruise speed for a second segment of the at least two discreet segments that satisfies the RTA given the calculated arrival time at the first recourse waypoint. The implementation can also include, for each generated wind speed scenario for the last segment of the at least two discreet segments, calculating an arrival time at the final waypoint based on the last segment wind speed scenario and a previous segment nominal cruise speed; and calculating a total fuel burn over the flight path. The implementation can also include generating a distribution of total fuel burn along the flight path based on the calculated total fuel burns and calculating an expected, or mean, total fuel burn along the flight path based on the distribution of the total fuel burn.

A further implementation can include, for each generated wind speed scenario for the first segment of the at least two discreet segments, iteratively determining a mean arrival time at the final waypoint for the first segment wind speed scenario that falls within a specified range the RTA. Iteratively determining can include generating a distribution of arrival time at the final waypoint for the first segment based on generated wind speed scenarios for the second segment, calculating a mean arrival time at the final waypoint based on the distribution of arrival time, and determining if the mean arrival time is outside of a specified range of the RTA. If the mean arrival time is outside of the specified range of the RTA, perturbing the second segment nominal cruise speed to generate two or more perturbed cruise speeds, and for each of the two or more perturbed cruise speeds, repeating the steps of generating a distribution of arrival time and calculating a mean arrival time, wherein the steps are performed based on the perturbed speed instead of the nominal speed. Determining can also include selecting an approximate speed based on, the second segment nominal cruise speed and the two or more perturbed speeds, and the mean arrival time calculated for the second segment nominal cruise speed and the mean arrival times calculated for each of the two or more perturbed speeds, and determining if the selected approximate speed is outside a specified range of the second segment nominal cruise speed. If the selected approximate speed it outside the specified range, repeating the steps of, generating a distribution of arrival time, calculating a mean arrival time, and determining if the mean arrival time is outside of a specified range of the RTA, based on the selected approximate speed as the new second segment nominal cruise speed.

According to another example implementation, a computer-readable medium is provided that stores instructions that, when executed by at least one processor in a system, cause the system to perform a method. The method can be the method for calculating an advised travel speed providing improved conformity to a target time of arrival with reduced fuel burn, as described above.

According to another example implementation, a system is provided. The system can include a display, at least one processor in communication with the display, a user input device in communication with the at least one processor, and at least one memory in communication with the at least one processor. The memory may be configured for storing data and instructions that, when executed by the at least one processor, cause the system to execute a method. The method can be the method for calculating an advised travel speed providing improved conformity to a target time of arrival with reduced fuel burn, as described above.

According to an example implementation of the disclosed technology, a method for modeling wind forecast uncertainty along a planned flight route is provided. The method can include receiving historical flight data comprising recorded wind speeds along a planned flight route having an origin and destination, receiving forecasted wind speeds along the planned flight route, comparing the recorded wind speeds and forecasted wind speeds and modeling, based on the comparing, wind speed uncertainty using a correlated stochastic process.

In a further implementation, comparing and modeling can include generating error values along the planned flight route based on comparing the recorded wind speeds and the forecasted wind speeds, dividing the planned flight route into discrete segments based on pre-defined intervals, clustering the error values at the intervals, preparing a histogram for each cluster of error values by binning the error values in each cluster by intensity, generating a set of transition probability matrices by stepping through the histograms and recording transition probabilities between positions, and forming a Markov chain as a function of position along the planned flight route and the transition probabilities between the positions.

In another further implementation, the method can also include extracting recorded wind speeds associated with cruise segments of a flight from the historical flight data. The compared recorded wind speeds can be the recorded wind speeds associated with cruise segments of a flight. The method an also include converting one or more of the recorded wind speeds and the forecasted wind speeds to compatible formats for comparison. The compared recorded wind speeds comprise recorded wind speeds from flight routes having a same origin and destination as the planned flight route. In yet another further implementation, the intervals can be based on distance, Area Navigation (RNAV) waypoints, or on time. A time-based interval can be about 300 seconds.

According to another example implementation, a computer-readable medium is provided that stores instructions that, when executed by at least one processor in a system, cause the system to perform a method. The method can be the method modeling wind forecast uncertainty along a planned flight route, as described above.

According to another example implementation, a system is provided. The system can include a display, at least one processor in communication with the display, a user input device in communication with the at least one processor, and at least one memory in communication with the at least one processor. The memory may be configured for storing data and instructions that, when executed by the at least one processor, cause the system to execute a method. The method can be the method modeling wind forecast uncertainty along a planned flight route, as described above.

These and other objects, features, and advantages of disclose technology will become more apparent upon reading the following specification in conjunction with the accompanying figures.

BRIEF DESCRIPTION OF THE FIGURES

FIG. 1A illustrates a segmented flight path with wind speed conditions along the flight path represented as vectors at an angle to the flight path, according to an example implementation of the disclosed technology.

FIG. 1B illustrates a vector associated with a planned air speed at a point along the flight path illustrated in FIG. 1A chosen in order to compensate for wind speed experienced at that point, according to an example implementation of the disclosed technology.

FIG. 2A illustrates a planned air speed chosen based on the forecasted wind conditions such that the sum of the vectors representing the planned air speed and forecasted wind speed results in a desired planned ground speed along the desired flight path, according to an example implementation of the disclosed technology.

FIG. 2B illustrates a scenario where the actual wind speed experienced at a point along the flight path is different than the forecasted wind speed, according to an example implementation of the disclosed technology.

FIG. 2C illustrates a scenario where the actual ground speed is different from the planned ground speed, according to an example implementation of the disclosed technology.

FIGS. 8A-B illustrate transition matrices in the form of probability heat maps for the east and north directions, respectively, according to an example implementation of the disclosed technology.

DETAILED DESCRIPTION

Figure 3A:
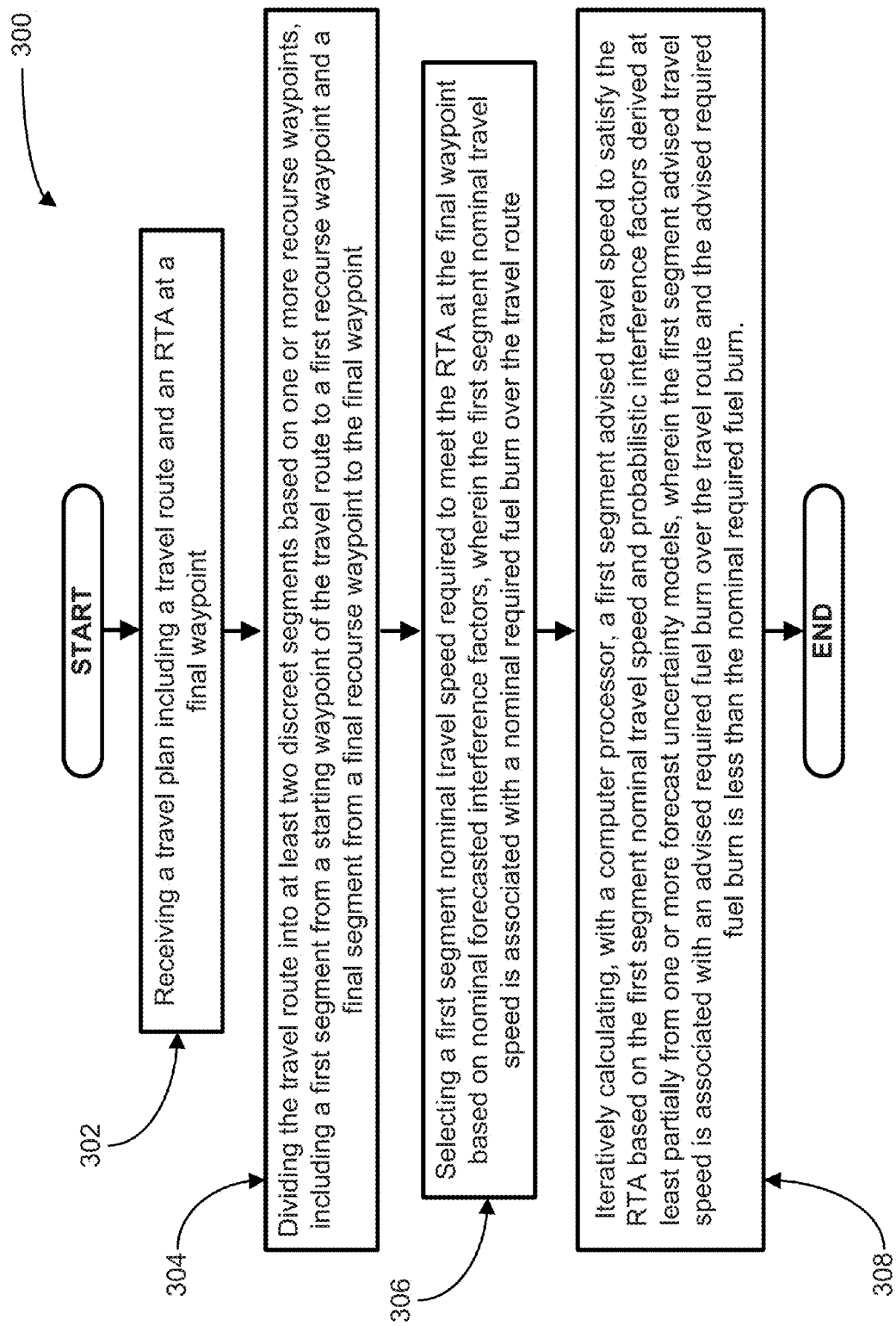
FIG. 3A illustrates a flow diagram of a method for calculating an advised travel speed providing conformity to an RTA with reduced fuel burn, according to an example implementation of the disclosed technology.

Example implementations of the disclosed technology include flight management systems and control methods providing improved conformity to an assigned required time of arrival constraint with reduced required fuel burn. In particular, implementations of the flight management systems and control methods are described in the context of methods accounting for wind forecast uncertainty in required time of arrival calculations. Implementations of the disclosed technology, however, are not limited to this context. Rather, implementations of the disclosed technology may be used in conjunction with various modes of travel, including, without limitation, land, air, sea, and space travel, influenced by a variety of interference factors based on, without limitation, traffic, wind, current, and solar data.

Example implementations of the disclosed technology also include wind forecast uncertainty models and methods for modeling the same. In particular, implementations of the wind forecast uncertainty models are described in the context of a Markov chain formulation.

Implementations of the disclosed technology, however, are not limited to this context. Rather, implementations of the disclosed technology include wind forecast uncertainty models cast in vector autoregressive processes, autoregressive-moving-average models, and other correlated stochastic processes.

All or a portion of the disclosed technology can be embodied in a computer program product on a computer-readable medium, executable by a computer processor of a computing device. In some example implementations, the disclosed technology can comprise a specialized computing device.

To facilitate an understanding of the principles and features of the disclosed technology, various illustrative implementations are explained below. Although example implementations of the disclosed technology are explained in detail, it is to be understood that other implementations are contemplated. Accordingly, it is not intended that the disclosed technology is limited in its scope to the details of construction and arrangement of components set forth in the following description or illustrated in the drawings. The disclosed technology is capable of other implementations and of being practiced or carried out in various ways. Also, in describing the example implementations, specific terminology will be resorted to for the sake of clarity.

The components described hereinafter as making up various elements of the disclosed technology are intended to be illustrative and not restrictive. Many suitable components that would perform the same or similar functions as the components described herein are intended to be embraced within the scope of the disclosed technology. Such other components not described herein can include, but are not limited to, for example, similar components that are developed after development of the disclosed technology.

It must also be noted that, as used in the specification and the appended claims, the singular forms "a," "an" and "the" include plural referents unless the context clearly dictates otherwise.

Also, in describing the preferred implementations, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" one particular value and/or to "about" or "approximately" another particular value. When such a range is expressed, another implementation includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

The disclosed technology enables a new flight management system (FMS) required time of arrival (RTA) mode that can provide improved conformity to an assigned RTA constraint while reducing required fuel burn. In contrast to conventional FMS RTA technologies, which typically consider only deterministic forecast data, implementations of the disclosed technology can approach flight control as probabilistic optimization problem. In particular, implementations of the disclosed technology can account for wind forecast uncertainty in RTA calculations by reformulating the speed and thrust profile problem as a multi-stage stochastic program, using a forecast uncertainty model to generate scenario sets for the fuel optimization problem. To this end, the example implementations of the disclosed technology introduce novel RTA and fuel optimization logic and data-driven wind forecast uncertainty models for driving the optimization problem.

By recasting the RTA problem in a probability space, confidence bounds can be generated in time-to-fix calculations across a range of possible scenarios based on forecast uncertainty. In essence, the focus can be shifted from how accurate the time-to-fix estimation is, to how good or bad it could probably be based on the uncertainty characteristics of the wind forecast. Optimization can then occur across probable forecast scenarios to generate stochastically optimal speed and thrust profiles at any point along the planned route as aggressively or as conservatively as necessary based on a specified confidence in the time-to-fix estimation, resulting in reduced fuel burn. This approach can eliminate the "wait and see" approach inherent to conventional FMS architectures, and represents a paradigm shift in the way strategic en-route control is approached from an aircraft standpoint. Thus, implementations of the disclosed technology can facilitate long-term strategic planning Referring now to the figures, in which like reference numerals represent like parts throughout the views, various implementations of disclosed technology will be described in detail.

I. Wind Uncertainty and Required Time of Arrival

FIG. 1A illustrates a segmented flight path 100 with wind speed 110 conditions along the flight path represented as vectors at an angle to the flight path. The wind speed 110 vectors shown in FIG. 1A represent the forecasted or expected wind conditions to be experienced by an aircraft at various points along the flight path.

FIG. 1B illustrates a vector associated with a planned air speed 120 at a point along the flight path 100 illustrated in FIG. 1A chosen in order to compensate for wind speed experienced at that point, as represented by the wind speed 110 vector. As shown in FIG. 2A, a planned air speed 120 can be chosen based on the forecasted wind conditions such that the sum of the vectors representing the planned air speed 120 and forecasted wind speed 110 results in a desired planned ground speed 130 along the desired flight path 100.

However, forecasted wind speeds may not accurately represent wind conditions actually experienced by an aircraft travelling along a flight path. FIG. 2B illustrates a scenario where the actual wind speed 115 experienced at a point along the flight path 100 is different than the forecasted wind speed 110. Thus, as shown in FIG. 2C, the resulting actual ground speed 135 can be different from the planned ground speed 130.

In some cases, the actual wind conditions experienced at a point along the flight path might be more favorable to an aircraft travelling along the flight path than forecasted. For example, an aircraft travelling along the flight path could experience an unexpected tailwind or diminished crosswinds.

Current FMS control architectures consider only a deterministic wind speed forecast. Thus, as conventional FMS are unable to account for uncertainty in the forecasted wind speeds, they cannot consider all possible scenarios, including those more favorable to an aircraft in which it can meet an assigned RTA.

Based on the inherent uncertainty structure of a wind forecast model used to generate estimated flight profiles, there can be a quantifiable probability that an aircraft may experience more favorable conditions in which it is possible to meet an RTA not previously possible given the current known conditions. In contrast to conventional FMS technology, implementations of the disclosed technology can leverage knowledge of these probable scenarios when considering the fuel-optimal speed profile required to meet an RTA. The FMS RTA algorithm will now be discussed in detail.

II. FMS RTA Algorithm

For an aircraft at cruise with an assigned RTA at some point in the future, an estimated arrival time at the RTA fix can be calculated based on the forecasted winds aloft. Due to uncertainty in the wind speed forecast however, the winds encountered by the aircraft may not match exactly those anticipated based on the forecast, and the aircraft's actual arrival time at the RTA fix can differ from the estimate in the absence of intervention.

For a series of waypoints between the RTA fix and the aircraft's current position, and by describing the arrival time of the aircraft at these waypoints probabilistically using a wind speed forecast uncertainty model, decisions can be made on the current cruise speed based on the need to amend that decision later in order to meet the RTA given the known probability of future scenarios. In some implementations of the disclosed technology, the strategy for choosing cruise speeds can be both fuel efficient and ensure the aircraft satisfies the RTA with some specified probability.

An example method 300 for calculating an advised travel speed providing conformity to a target time of arrival with reduced fuel burn will now be described with reference to the flow diagram of FIG. 3A.

The method 300 starts in block 302, and according to an example implementation, includes receiving a travel plan including a travel route and an RTA at a final waypoint. In an example implementation, the travel plan can be a flight plan, the travel route can be a flight path. Although the following examples are described in the context of meeting an assigned RTA by air travel, one of skill in the art will recognize that the techniques discussed herein are generally applicable to meeting an assigned target time of arrival for any type of fuel-constrained travel.

In block 304, the method 300 includes dividing the travel route into at least two discreet segments based on one or more recourse waypoints, including a first segment from a starting waypoint of the travel route to a first recourse waypoint, and a last segment from a last recourse waypoint to the final waypoint. In an example implementation, the starting waypoint and final waypoint can represent the beginning and end of the cruise portion of a flight, respectively. A recourse waypoint can be a point in the flight path where a decision can be made to maintain or alter the current cruise speed. Although some example implementations of the disclosed technology can support an arbitrary number of recourse waypoints, additional recourse waypoints can require additional calculation by the flight management system. Moreover, there can be fuel transaction costs associated with changing the thrust of an aircraft. Accordingly, although additional recourse waypoints can provide in-flight flexibility, large numbers of recourse waypoints may be subject to diminishing returns in reducing fuel burn.

In block 306, the method 300 includes selecting a first segment nominal travel speed required to meet the RTA at the final waypoint based on nominal forecasted interference factors, wherein the first segment nominal travel speed is associated with a nominal expected fuel burn over the travel route. In an example implementation, the first segment nominal travel speed can be a first segment nominal cruise speed.

In some implementations, the nominal forecasted interference factors can include, but need not be limited to, forecasted wind speed data. Forecasted wind speed data is available from a variety of forecast products, such as the NCEP Rapid Update Cycle (RUC-2) model.

In an example implementation, the first segment nominal travel speed can be a speed or Mach number selected based on a conventional deterministic consideration of forecasted interference factors, including wind conditions expected to be encountered along the flight path. In an example implementation, the first segment nominal travel speed can be calculated by breaking the complete flight path into discreet segments of a predefined length. The flight time along the flight path can be calculated for a range of speeds, and the nominal forecasted wind speeds at each breakpoint or segment can be loaded dynamically based on the estimated flight time along each segment. The speed which most closely satisfies the RTA can be selected as the first segment nominal travel speed.

The first segment nominal travel speed can be associated with a nominal expected fuel burn required to satisfy the RTA. The nominal expected fuel burn can be considered a baseline expected fuel burn. A benefit of the FMS RTA algorithm is calculating an advised travel speed for meeting an RTA that results in a reduced expected fuel burn over the nominal expected fuel burn.

In block 308, the method 300 includes iteratively calculating, with a computer processor, a first segment advised travel speed to satisfy the RTA based on the first segment nominal travel speed and probabilistic interference factors derived at least partially from one or more forecast uncertainty models, wherein the first segment advised travel speed is associated with an advised expected fuel burn over the travel route and the advised expected fuel burn is less than the nominal expected fuel burn.

The first segment advised travel speed can be a speed or Mach number suggested by FMS RTA algorithm based on a probabilistic assessment of wind conditions along the flight path. The first segment advised travel speed can be associated with an advised expected fuel burn for the flight path. In an example implementation, the advised expected fuel burn can be less than the nominal expected fuel burn, reflecting a reduction in expected fuel burn provided by the FMS RTA algorithm. In an example implementation, the first segment advised travel speed can be a first segment advised cruise speed.

In an example implementation, the probabilistic interference factors can include or be based on historical data, such as recorded wind speeds. In an example implementation, the interference factors can be derived from one or more forecast uncertainty models, such as a wind forecast uncertainty model. Example wind forecast uncertainty models suitable for use with the FMS RTA algorithm and methods for producing same are discussed later herein.

In some implementations, iteratively calculating can include calculating the nominal expected fuel burn along the flight path based on the first segment nominal cruise speed until a stopping condition is reached. For example, in one implementation, iteratively calculating can also include perturbing the first segment nominal cruise speed to generate two or more first segment perturbed cruise speeds. The first segment perturbed speeds can be incremental variations to the first segment nominal cruise speed in either direction. For example, a 5% variation applied to a Mach number of 0.8 can result in perturbed speeds of Mach 0.76 and Mach 0.84. The number of perturbations chosen affects the number of data points available for selecting an advised cruise speed to reduce or minimize fuel burn. For example, at least three data points are required for a quadratic fit. Thus, first segment nominal cruise speed can be perturbed at least twice, e.g., once in both directions, to estimate a first segment advised cruise speed based on a quadratic fit.

The expected fuel burn can be calculated for each of the two or more first segment perturbed cruise speeds, providing data for the approximation. In an example implementation, a second- or higher-order polynomial approximation can be used. Alternatively, another suitable line searching method can be used, such as Newton-Powell, BFGS, Golden Ratio, etc. In the following example a quadratic fit is described, as an aircraft's fuel burn can be generally quadratic with respect to Mach number. Various methods of calculating the fuel burn for a speed or thrust profile will be obvious to one of skill in the art.

For an example approximation, the first segment nominal cruise speeds and perturbed cruise speeds can be independent variables and their respective associated fuel burn values the dependent variables. From this data, an approximate cruise speed can be selected that minimizes a quadratic regression or simply provides a reduced fuel burn over the first segment nominal cruise speed. In an example implementation, it can be determined whether the selected approximate cruise speed is outside of a specified or predefined range of the first segment nominal cruise speed. For example, the predefined range can be plus or minus 0.01 Mach of the nominal cruise speed. If the selected approximate cruise speed is indeed outside of the range of the first segment nominal cruise speed, the first segment nominal cruise speed can be set to the selected approximate cruise speed, and the steps for iteratively calculating can repeat with the new first segment nominal cruise speed. Otherwise, the iterations can conclude as an approximate speed within the predefined range of the first segment nominal speed can indicate convergence. Iteratively calculating can conclude with the selected approximate cruise speed as the first segment advised cruise speed.

In an example implementation, the expected fuel burn over the flight path for a nominal or perturbed cruise speed can be calculated by generating probabilistic wind speed scenarios for each segment of the flight path. The wind speed scenarios can be generated based on perturbing the nominal forecasted wind speed data for each segment based on correlated statistics from the wind forecast uncertainty model. For example, in an example implementation, generating a wind speed scenario for a segment can include, dividing the segment into two or more sub-segments based on one or more breakpoints, loading nominal forecasted wind speed data at each breakpoint based on an estimated flight time to the breakpoint, sampling a forecast error distribution based on the wind forecast uncertainty model at each breakpoint, and adding the sampled forecast error term for each breakpoint to the nominal forecast. The estimated flight time to the breakpoint can be based on the speed for which the expected fuel burn is being generated.

Figure 3B:
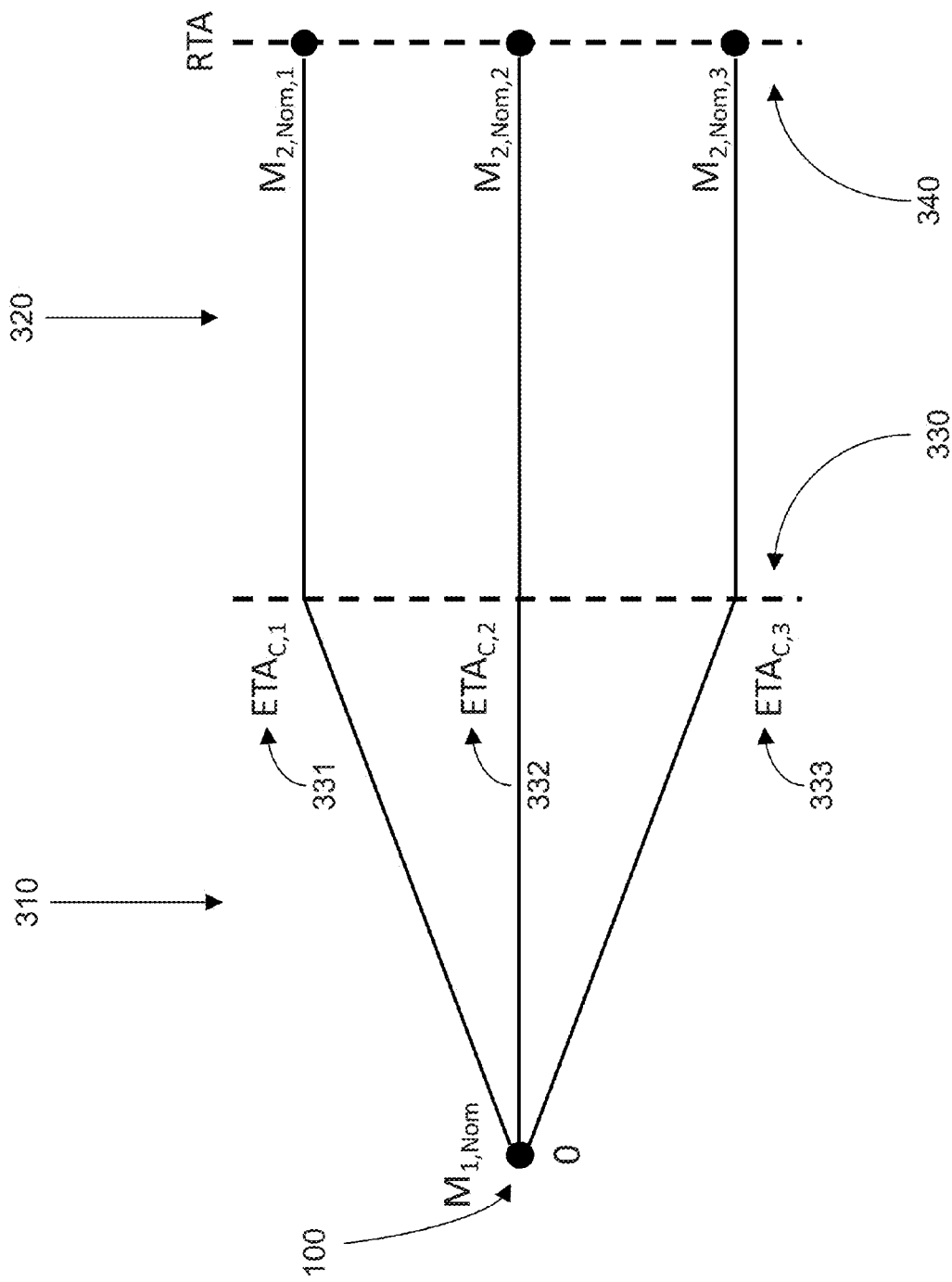
FIG. 3B illustrates a notional diagram of two segments of a flight path with three wind speed scenarios for the first segment.

FIG. 3B illustrates a notional diagram of a flight path 100 with two segments 310, 320 and three wind speed scenarios for the first segment 310. As shown in FIG. 3B, wind speed scenarios for the first segment 310 of the flight path 100 can be generated, and an arrival time 331, 332, 333 at the first recourse waypoint 330 can be calculated for each of the wind speed scenarios based on the particular wind speed scenario and the first segment (nominal or perturbed) cruise speed. For each first segment wind scenario, a second segment nominal cruise speed can be calculated for the second segment 320 to satisfy the RTA at the final waypoint 340 based on the calculated arrival time 331, 332, 333 at the first recourse waypoint 330. Wind speed scenarios for the second segment 320 can be generated, and for each wind speed scenario, an arrival time at a next waypoint can be calculated.

For each next segment except the last segment, wind speed scenarios can be generated and arrival times at the next or following recourse waypoint in the flight path can be calculated for each wind speed scenario based on the particular wind speed scenario and the previous segment cruise speed. The cruise speed for the next segment can be calculated to satisfy the RTA at the final waypoint. For example implementations with multiple recourse waypoints and a large number of wind speed scenarios for each segment, the flight path can rapidly expand into branching tree of possible outcomes for meeting an assigned RTA. For example, the FMS RTA algorithm applied to a flight path with two recourse waypoints and ten wind speed scenarios for each segment could consider 10^3, or 1000 outcomes in an iteration calculating expected fuel burn over the flight path.

For the last segment, wind speed scenarios can be generated and arrival times at the final waypoint in the flight path can be calculated for each wind speed scenario based on the particular wind speed scenario and the previous segment cruise speed. After calculating the arrival time at the final waypoint for generated wind speed scenarios for the last segment, a total fuel burn over the flight path can be calculated for each outcome of the branching scenarios of the flight path.

A distribution of the total fuel burn can be generated based on the calculated total fuel burn values for all outcomes, and the expected fuel burn along the flight path can be calculated based on the distribution of total fuel burn. For example, the nominal expected fuel burn can be the mean of the distribution of the total fuel burn.

In an example implementation, calculating the nominal expected fuel burn can also include, for each generated wind speed scenario for the first segment of the at least two discreet segments, iteratively determining a mean arrival time at the final waypoint for the first segment wind speed scenario that falls within a specified range the RTA. In other words, so that on average, aircraft conforming to the scenario will arrive by the RTA.

In a further implementation, iteratively determining a mean arrival time for a first segment wind speed scenario can include calculating a mean arrival time at the final waypoint based on the distribution of arrival time, and determining if the mean arrival time is outside of a specified range of the RTA. If the mean arrival time is outside of the specified range of the RTA, the second segment nominal cruise can be perturbed speed to generate two or more perturbed cruise speeds, and for each of the two or more perturbed cruise speeds, the steps repeated of generating a distribution of arrival time and calculating a mean arrival time, but based on the perturbed speed instead of the nominal speed. An approximate speed can be selected based on, the second segment nominal cruise speed and the two or more perturbed speeds, and the mean arrival time calculated for the second segment nominal cruise speed and the mean arrival times calculated for each of the two or more perturbed speeds. For example, a quadratic fit and minimization technique can be used to select the approximate speed.

Next, it can be determined if the iteration is a meaningful improvement over a previous iteration or if the results of iteratively determining have converged, based on whether the selected approximate speed is outside a specified range of the second segment nominal cruise speed. If the selected approximate speed it outside the specified range, the steps can be repeated of generating a distribution of arrival time, calculating a mean arrival time, and determining if the mean arrival time is outside of a specified range of the RTA, based on the selected approximate speed as the new second segment nominal cruise speed.

As an alternative to specifying a predefined range of the RTA, a requirement that a certain percentage of the aircraft arrive by a certain time can be enforced. For example, the method could require that 70% of arrival times fall before the RTA. A fit could then be constructed to determine the speed that causes this condition, instead of centering the mean arrival time on the RTA. Other suitable techniques for configuring distributions of arrival times for scenarios will be apparent to one of skill in the art.

Example logic for an implementation of the FMS RTA algorithm configured to handle a flight path with one recourse waypoint and two discreet segments, according to an example implementation of the disclosed technology, is presented below:

1. Initialization
   a) The aircraft flight plan, including the required time of arrival (RTA) at the final waypoint is loaded.
   b) The stage-1 nominal cruise speed required to meet the RTA is calculated.
      i) The complete flight path is broken into discreet segments of a predefined length.
      ii) The flight time along the complete flight path is calculated for a range of aircraft Mach numbers as nominal forecasted wind speeds are loaded dynamically based on estimated flight time along each segment.
      iii) The Mach number from step (1-a-ii) which most closely satisfies the RTA is selected as the "stage-1 nominal cruise speed."
   c) The path is broken into two discrete segments based on a user-specified recourse waypoint. The segment from the start of the flight plan to the recourse waypoint is herein referred to as "stage-1;" the segment from the recourse waypoint to the final waypoint is herein referred to as "stage-2."
2. Stage-1
   a) N-1 stage-1 wind speed scenarios are generated by perturbing the nominal wind speed forecast using correlated statistics from the wind forecast uncertainty model.
       iv) The stage-1 flight path is broken into discreet segments of a predefined length.
       v) The nominal forecasted wind speed is loaded dynamically at each segment break point based on the estimated flight time to each break point using the stage-1 nominal cruise speed.
       vi) The forecast error distribution at each break point is sampled.
       vii) The sampled forecast error term from (2-a-iii) is added to the nominal forecasted wind speed at each break point.
   b) For each stage-1 scenario:
       i) The flight time to the recourse waypoint is calculated using the wind speed scenario, and the stage-1 nominal cruise speed.
       ii) The stage-2 cruise speed required to meet the RTA given the arrival time at the recourse waypoint is calculated.
           (1) The stage-2 flight path is broken into discreet segments of a predefined length.
           (2) The flight time along the stage-2 path is calculated for a range of aircraft Mach numbers given the current wind speed scenario for stage-1, and the nominal wind speed scenario for stage-2.
           (3) The Mach number from step (2-b-ii-2) which most closely satisfies the RTA is selected as the "stage-2 nominal cruise speed" for this particular stage-1 scenario.
3. Stage-2
   a) N-2 stage-2 wind speed scenarios are generated by perturbing the nominal wind speed forecast using correlated statistics from the wind forecast uncertainty model.
       i) The stage-2 flight path is broken into discreet segments of a predefined length.
       ii) The nominal forecasted wind speed is loaded dynamically at each segment break point based on the estimated flight time to each break point using the stage-2 nominal cruise speed.
       iii) The forecast error distribution at each break point is sampled.
       iv) The sampled forecast error term from (3-a-iii) is added to the nominal forecasted wind speed at each break point.
   b) For each stage-2 scenario:
       i) The flight time to the RTA waypoint is calculated using the stage-2 wind speed scenario, and the stage-2 nominal cruise speed.
       ii) The fuel burned along the entire flight path is calculated.
   c) For each stage-1 scenario:
       i) Distributions of arrival time at the RTA waypoint and total fuel burn are generated using the stage-2 scenarios.
           (1) If the mean arrival time to the RTA fix of the stage-2 scenarios is within a predetermined adherence level of the RTA, stage-2 is complete for this stage-1 scenario.
           (2) Else:
               (a) The stage-2 nominal cruise speed is perturbed in both directions, and the algorithm cycles from (3-b) to (3-c) for each perturbed cruise speed.
               (b) A 3-point quadratic approximation is fit using the stage-2 nominal cruise speed and the perturbed stage-2 cruise speeds as the independent variables, and the difference between the corresponding mean arrival times at the RTA fix from (3-c-i-1) and the RTA as the dependent variables.
               (c) The cruise speed to minimize the quadratic approximation from (3-c-2-b) is determined, and is herein referred to as the "stage-2 approximated speed."
                   (i) If the stage-2 approximated speed is within a specified range of the stage-2 nominal cruise speed, stage-2 is complete, and the algorithm continues at (3-d).
                   (ii) Else:
                       1. The stage-2 nominal cruise speed is set as the stage-2 approximated speed from (3-c-i-2-c).
                       2. The algorithm cycles starting at (3-b).
       d) A distribution of the total fuel burn along the complete path is generated using the total estimated fuel burn values across all stage-1 and stage-2 scenarios.
       e) The expected value of the total fuel burn along the complete path is calculated.
4. Convergence
   a) The stage-1 nominal cruise speed is perturbed in both directions, and the algorithm cycles from (2) to (3-e) for each perturbed cruise speed.
       i) A 3-point quadratic approximation is fit using the stage-1 nominal cruise speed and the perturbed stage-1 cruise speeds as the independent variables, and the expected value of the total fuel burns from (3-e) as the dependent variables.
       ii) The cruise speed to minimize the quadratic approximation from (4-a-i) is determined, and is herein referred to as the "stage-1 approximated speed."
           (1) If the stage-1 approximated speed is within a specified range of the stage-1 nominal cruise speed, the algorithm has converged and the stage-1 nominal speed is the advised stage-1 cruise speed.
           (2) Else:
               (d) The stage-1 nominal cruise speed is set as the stage-1 approximated speed from (4-a-ii).
               (e) The algorithm cycles starting at (2).

In this example, the stage-1 cruise speed from (4-a-ii-(1)) enables the fuel-efficient or fuel-reduced case to be achieved for the complete path given a change in cruise speed is required at the recourse decision waypoint in order to meet the RTA.

Experimental Results

Example implementations of the disclosed technology were tested using a series of flight path scenarios. One particular scenario tested is a direct flight between Los Angeles International Airport (LAX) and Hartsfield-Jackson International Airport (ATL). In this scenario, an aircraft starts its cruise at an initial Mach number of 0.745 in order to meet an RTA in Atlanta Center 10700 seconds in the future. Also in this scenario, a single recourse waypoint was chosen halfway along the direct route. Thus, the initial advised cruise speed can be maintained through the first half of the journey, after which an adjustment in the held cruise Mach number can be made in order to meet the RTA.

After analyzing the routing scenario, winds aloft, and performance characteristics of the aircraft, an example implementation of the algorithm advised an initial Mach number of 0.735 in order to minimize the fuel-burn impact of adjusting the cruise speed at the decision waypoint if necessary to meet the RTA.

Figure 4A:
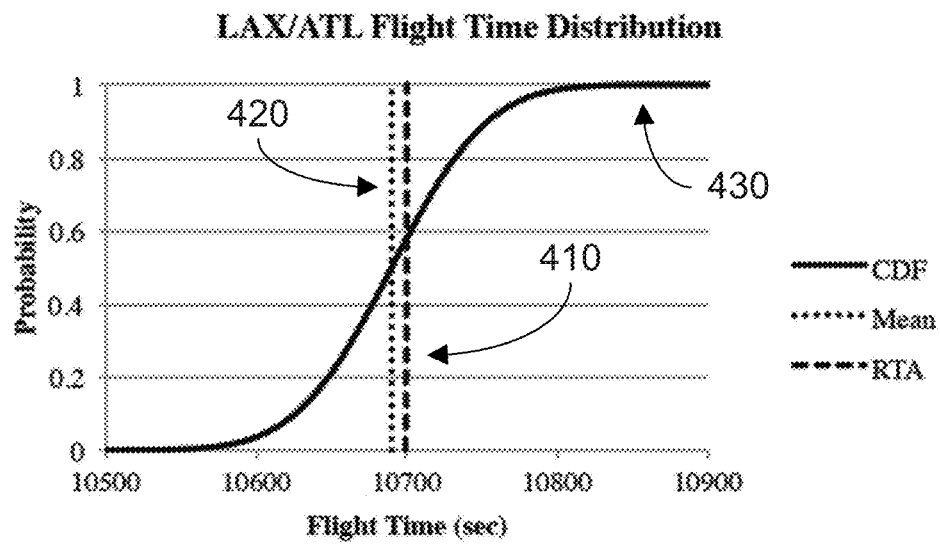
FIGS. 4A-B illustrate flight time results and fuel burn results, respectively, of the FMS RTA algorithm, according to an example implementation of the disclosed technology.
Figure 4B:
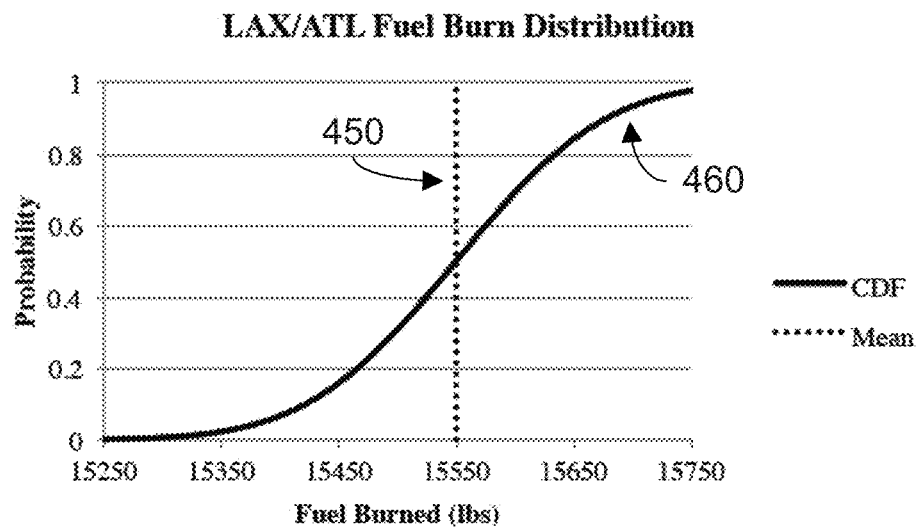

FIG. 4A-B illustrates notional results for the LAX to ATL scenario. As shown in FIG. 4A, using the example algorithm's advised Mach number leads to a mean flight time of 10,692 seconds 420 based on the forecast uncertainty model for this route. The cumulative density function 430 for the expected arrival time at the RTA 410 fix is also shown. FIG. 4B similarly depicts the fuel burn distributions calculated for this scenario and shows the cumulative density function and mean fuel burn 450.

III. Forecast Uncertainty Model

The future position uncertainty of an aircraft found via a trajectory prediction can grow rapidly as a function of forecast distance. In the context of the general RTA problem, future position uncertainty may result from dynamics modeling errors, errors in the input data used to model various aspects of the aircraft's future state (for example, the intended flight path of the aircraft, forecasted winds along the route, pilot behavior, etc.), and to some degree, the ability of the FMS and control system to accurately track the aircraft's planned path.

However, when the scenario under consideration is restricted to the en-route RTA problem (for example, when an aircraft is in cruise), it can be assumed with reasonable confidence that the aircraft intent information is substantially fixed, the aircraft is able to accurately track the planned flight path, and pilot input is minimized as the aircraft will typically be under autopilot control. Thus, sources of trajectory prediction uncertainty can be primarily limited to the aggregate effects of wind speed forecasting error.

Example implementations of the disclosed technology can account for wind forecast uncertainty in RTA calculations by reformulating the speed and thrust profile problem as a multi-stage stochastic program, utilizing a wind forecast uncertainty model to generate scenario sets for the fuel optimization problem.

In order to generate an effective FMS-suitable stochastic algorithm, a robust wind forecast uncertainty model is needed. Prior efforts based on the NCEP Rapid Update Cycle (RUC-2) forecast product (and legacy models) have produced only wind forecast uncertainty models suited for studies involving conflict detection scenarios and short-term optimal route planning.

Moreover, conventional studies are limited to the context of the forecast itself, and do not address the issue of forecast uncertainty on flight profile estimation. In particular, conventional studies rely on observations tied to specific geographic regions such as the Denver Center. Moreover, these studies fail to propose an uncertainty propagation model based in the uncertainty characteristics of the forecast product itself A more precise uncertainty correlation can describe the effects of long-term flight-profile estimation. In order to provide an FMS logic enabling long-term RTA capability, a forecast uncertainty correlation model that is applicable to a wide variety of routes through a given airspace is needed. Given this domain, it can be imprudent to utilize wind forecast uncertainty terms generated independently from an aircraft's geographic position as demonstrated in convention studies.

Moreover, instead of choosing the correlation structure based on the end-use of the algorithm, the uncertainty correlation of the RUC-2 forecast product can be quantified by means of a data-driven historical study. In doing so, a solution space can be generated for an FMS algorithm that adequately represents the real-world uncertainty encountered with RUC-2 wind forecast information.

In contrast to conventional studies, implementations of the disclosed technology can provide a forecast uncertainty model applicable to a wide variety of routes through the national airspace. Moreover, example implementations of the disclosed technology can provide position-specific, data-driven forecast uncertainty models.

Example Implementations

For an aircraft at cruise, there can exist a planned route through the airspace, a forecast of the winds expected along the route, and a measure of the wind speeds at current and past locations. This information can provide forecast uncertainty information that can be characterized as an error state—for example, the difference between the winds currently encountered and the winds expected to be encountered from a source of forecast data such as the RUC-2 forecast product. This state can then change as a function of position along the planned route as different regions of airspace are traversed. In conventional studies, it was assumed that this state evolved based on a variety of correlation schemes, none of which modeled the real-world behavior of the RUC-2 forecast product.

However, in some implementations of the disclosed technology, a model can be generated on a per-route basis that captures the inherent structure of a source of forecast data by, for example, examining a large number of similar routes through the forecast domain. In an example implementation, a Markov chain can be used to model this approach, as described in detail herein.

A Markov chain is a mathematical system that undergoes changes, or transitions, from a finite or countably infinite number of states to subsequent states in a chain-like manner. Markov chains can be considered random stochastic processes, however they are typically characterized as being "memoryless," or more formally, holding the Markov property. The Markov property requires that the conditional probability distribution of the future states of a stochastic process only depend on the current state, and not the sequence of states preceding it. For example, let X be an $\mathbb{R}^n$ stochastic process $X=(X_t, t \in I)$ on a probability space $(\Omega, \mathcal{F}, \mathbb{P})$. If X is considered to take discrete values, indexed by discrete time intervals n, X can be said to hold the Markov property if:

$$\mathbb{P}(X_n=x_n|X_{n-1}=x_{n-1}\ldots X_0=x_0)=\mathbb{P}(X_n=x_n|X_{n-1}=x_{n-1}) \quad (1)$$

In the context of the example aircraft scenario previously posed, the current error state $X_n$ at a discrete distance along the planned route indexed as position n can be considered to have some value $x_n$ representing the difference between the forecasted wind for the current position and the actual wind experienced at the current position, based solely on the error state at the previous position indexed as n−1 and holding a value $x_{n-1}$. In order to form a Markov chain, a measure is needed of the probability of transitioning to an error state $j:X_n=x_n$ given the previous state $i:X_{n-1}=x_{n-1}$ is known, $p_{ij}=\mathbb{P}(X_n=j|X_{n-1}=i)$. Simply put, the probability needs to be quantified of the measured forecast error taking a certain value at the current location along the planned route (referenced as state j), given the previous position along the planned route and the forecast error at that location (referenced as state i) is known. Once the transition probabilities have been quantified, a complete Markov chain can be described as a function of position along the planned route and the transition probabilities between each position:

$$\lambda \cdot X_j = [P^{ij}]^T X_i \quad (2)$$

where $\lambda=1$ as $P^{ij}$ is a right-stochastic matrix. If $X_i$ is considered to be a probability distribution representing a range of error measurements $x_i$, at the previous position indexed by n−1, then $X_j$ can be a conditional probability distribution representing the range of possible error values at the current position, indexed by n, based solely on the probability characteristics of the previous position.

In order to calculate transition probabilities, a data set providing a large number of recorded wind speed values along the route desired for study can be desirable, for example, having data for several thousand flights following the same route, reporting wind speed measurements at the same points referenced by elapsed flight time.

The Aircraft Communications and Reporting System (ACARS) data set can provide historical flight tracks along with corresponding atmospheric conditions recorded along each flight path. By comparing wind speed values extracted from the ACARS data set with their corresponding forecast values provided by the RUC-2 forecast product, a series of error measurements can be formed along specific routes through the NAS. By discretizing the distance along these routes, a series of error measurements clustered at discrete time intervals can be generated, resulting in a series of error measurements located at discrete distances along extracted flight tracks.

In some implementations of the disclosed technology, a flight route can be discretized into intervals according a function of elapsed flight time. For example, a flight route can be discretized into intervals corresponding to the standard 301 second reporting interval of participating ACARS aircraft. Alternatively, a flight route can be discretized according to a pre-defined distance interval or Area Navigation (RNAV) waypoints. For example, a flight route can be discretized into sectors with error measurements associated with a nearest sector.

Histograms can be prepared for each cluster of error measurements, binning error values by intensity and aggregating the results of all flights along the specific route. The binned measurement clusters can be analogized to the error states described by a Markov chain. Each cluster can be located at a specific distance along a flight track, and based on the distribution of error points described by the histogram at each discrete distance, the probability can be described of an aircraft experiencing a specific forecast error, or error state, at a specific distance along the flight track represented by the ACARS tracks. Furthermore, by tracking the error values as they transition from state to state along the route, the probability can be calculated of reaching a future error state based on the current location, and current error state. More specifically, transition probabilities can be generated for a Markov chain.

In another implementation, a vector autoregressive (VAR) process can be used to recast the forecast uncertainty model. A VAR-based model can allow tracking of a pseudo-continuous error signal as a VAR process can be fit using the full time-history of error states available as opposed to a sequence of discontinuous error states divided into discrete jumps. The introduction of a VAR process model can also allows for the vector components of the wind speed error to be re-coupled. Although re-coupling would not necessarily provide as direct a benefit as the continuous error signal functionality, it can enable the examination of the effects of directionality for routes traversing regions with both strong head/tail winds and crosswinds. Other correlated stochastic processes may be suitable for casting the forecast uncertainty model.

For the examples described herein, it was assumed that a large collection of data points clustered at a discrete interval along a common flight track was available. However, in situations where no two flights will follow the exact same route with any frequency acceptable for a study, an assumption can be made to bolster sparse data: flights between origin and destination airport pairs tend to follow similar routings through the airspace. By aggregating flights on an origin-destination basis, a Markov chain can be generated that is representative of the characteristics for of all flights between a specific origin and destination pair. This assumption can allow for the construction of scenario sets for the FMS algorithm that are representative of what an aircraft might experience in real-world operations between travel hubs. The origin-destination pairs chosen for the examples described herein are listed in Table 1. These pairs were chosen as they provide somewhat complete yet individually unique coverage of the NAS, and they are referenced using their corresponding three letter FAA designation.

TABLE 1

| Pairing | Origin | Destination |
|---------|--------|-------------|
| 1 | LAX | ATL |
| 2 | ATL | LAX |
| 3 | SEA | ATL |
| 4 | ATL | SEA |
| 5 | LGA | ATL |
| 6 | ATL | LGA |

As an alternative to aggregating data points based on direct routings between airport pairs and indexing states along the routes via elapsed flight time, some example implementations of the disclosed technology can consider all extracted track segments between RNAV waypoints along common jet routes, indexing the error states as fix-to-fix jumps. This approach can allow for more generalized flight scenarios to be built.

Further consideration can be given to the structure of the source of forecast data. For example, the National Centers for Environmental Prediction (NCEP) describes the RUC-2 product as an hourly data assimilation model that provides six-hour forecasts at twenty km horizontal resolution and fifty vertical levels on a one hour cycle, meaning that every hour a new six-hour forecast is available. Thus two scenarios for comparing recorded wind speed values from the extracted ACARS flights to those from the RUC-2 forecast include: fixing the forecast release hour and using a single forecast release for the duration of the ACARS flight, or updating the forecast information on an hourly basis and only using the first hour of the freshest forecast release. The first scenario can be analogous to a pilot loading wind forecasts into the FMS before takeoff and never updating the wind forecast information during flight, whereas the second scenario can be analogous to the pilot loading fresh wind information into the FMS as it becomes available. Implementations of the disclosed technology can consider both scenarios which are referenced herein as the "base" scenario for the former scenario, and the "updated" scenario for the latter.

Figure 6:
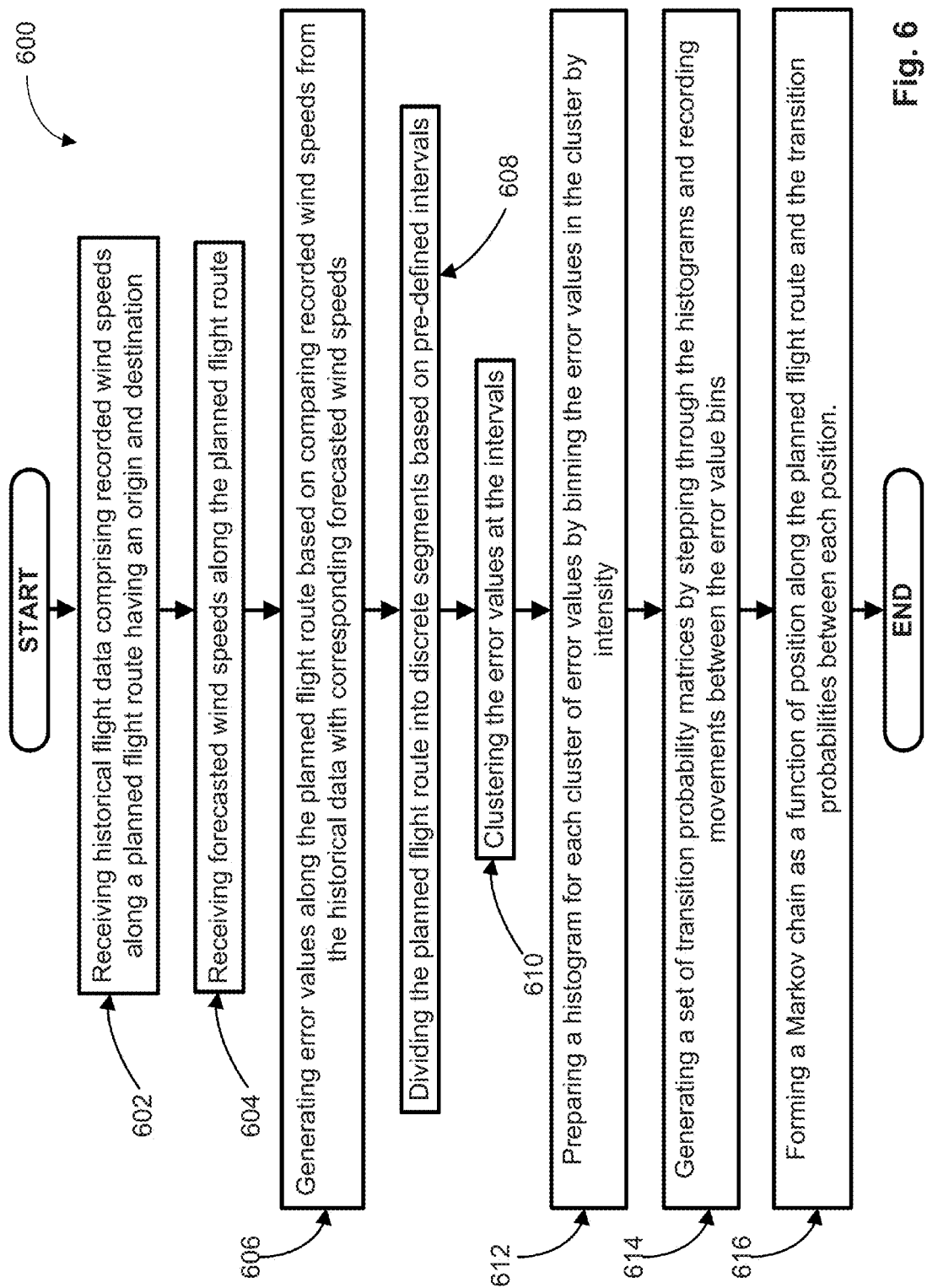
FIG. 6 illustrates a flow diagram of a method for modeling wind forecast uncertainty along a planned flight route, according to an example implementation of the disclosed technology.

An example method 600 for modeling wind forecast uncertainty will now be described with reference to the flow diagram of FIG. 6.

The method 600 starts in block 602, and according to an example implementation includes receiving historical flight data comprising recorded wind speeds along a planned flight route having an origin and destination.

In block 604, the method 600 includes receiving forecasted wind speeds along the planned flight route.

In block 606, the method 600 includes generating error values along the planned flight route based on comparing recorded wind speeds from the historical data with corresponding forecasted wind speeds.

In block 608, the method 600 includes dividing the planned flight route into discrete segments based on pre-defined intervals.

In block 610, the method 600 includes clustering the error values at the intervals.

In block 612, the method 600 includes preparing a histogram for each cluster of error values by binning the error values in each cluster by intensity.

In block 614, the method 600 includes generating a set of transition probability matrices by stepping through the histograms and recording the transition probabilities between the error value bins.

In block 616, the method 600 includes forming a Markov chain as a function of position along the planned flight route and transition probabilities between each position.

Format conversion may be necessary in order to meaningfully compare data historical and forecasted data sources. For example, the RUC-2 product provides wind speed forecasts in terms of u and v direction vector components, where each corresponds respectively to a local-East and local-North direction based a Lambert conformal projection. Accordingly, before comparing wind speed and direction values from the ACARS set, the RUC-2 vector components can be first transformed to a true-East, true-North convention consistent with the ACARS measurements. As a further consequence of the data structure and availability, each direction may have to be considered independently. As combinations of error magnitudes in each direction can provide a unique error state for a Markov chain, there may not enough data to generate valid transition probabilities for a directionally coupled Markov model. Thus, in the following example, the results of the Markov chain analysis are presented in terms of independent directions, "East" and "North."

Experimental Results

Findings for the Los Angeles (LAX)-Atlanta (ATL) origin-destination airport pair, base forecast scenario, are presented as an illustrative example.

Figure 5:
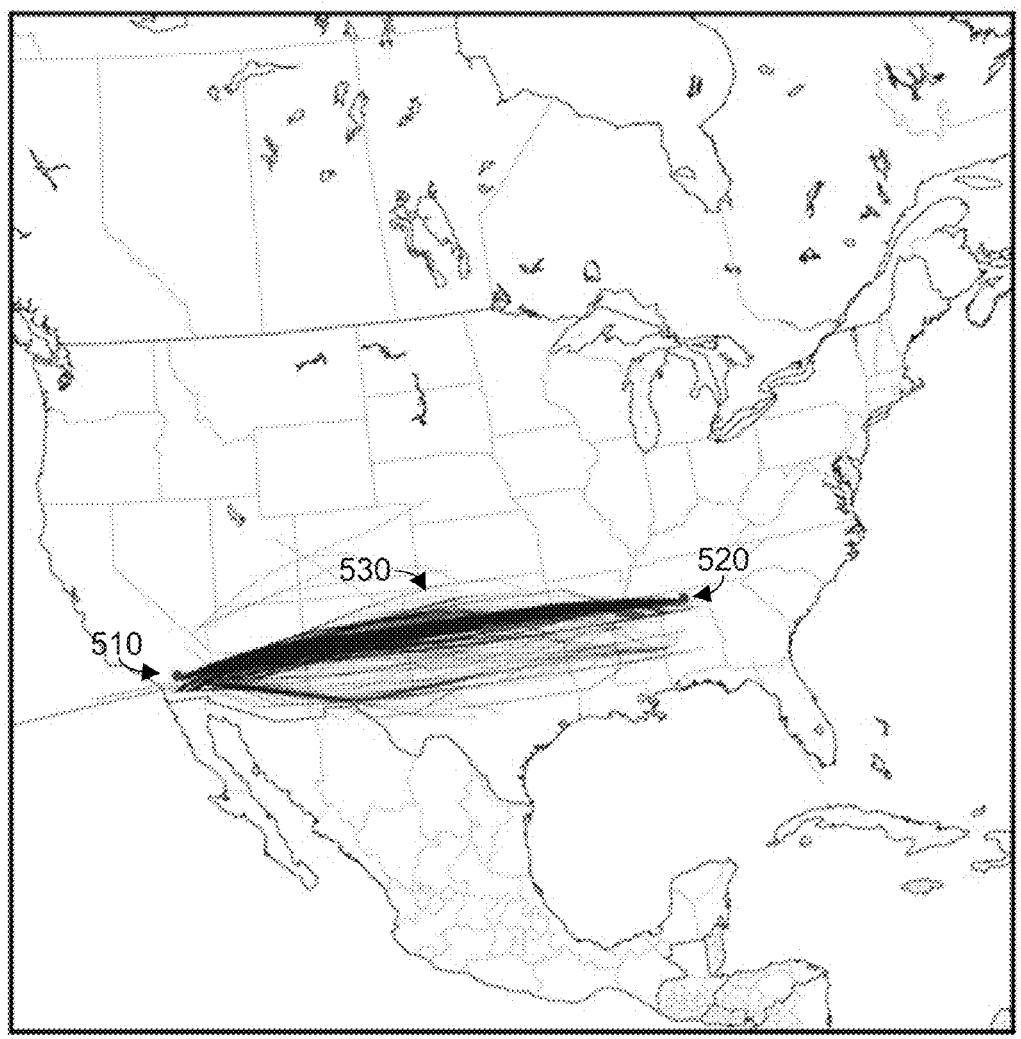
FIG. 5 illustrates one year of extracted flight tracks between LAX and ATL, according to an example implementation of the disclosed technology.

In the manner heretofore described, a Markov model was built from a foundation of wind speed forecast error values generated by comparing wind speed measurements along aggregated flight routes between an origin-destination airport pair from the ACARS data set with their corresponding values from the RUC-2 forecast model. One year of extracted ACARS flight tracks from 2008 between LAX 510 and ATL 520 are shown in FIG. 5. Before any wind measurements along these tracks were considered, the flight paths 530 were first trimmed to remove climb and descent segments. Data points that did not pass the ACARS data set's embedded quality control checks were also excluded from consideration. In doing so, impact of sensor error on the analysis can be mitigated by only considering consistent measurements taken during steady-level flight in the en-route regime. This condition is consistent with the anticipated initial operating domain of the RTA algorithm.

After comparing the ACARS wind speed measurements to the corresponding RUC-2 forecasts, a series of wind speed error values were generated as a function of elapsed time in cruise for the true-East and true-North directions. The error convention chosen for this analysis was error=forecasted−actual.

Figure 7:
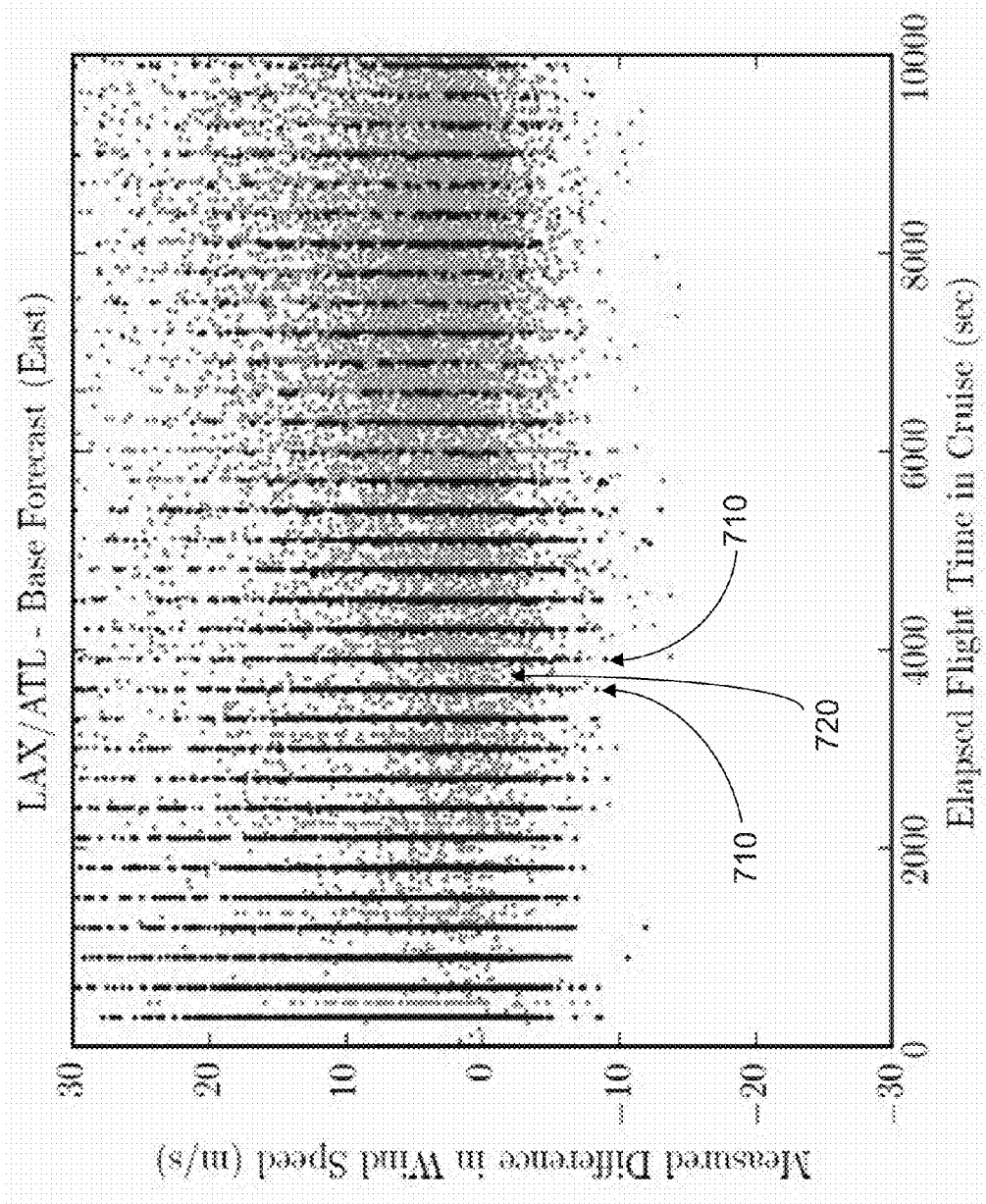
FIG. 7 illustrates the aggregate wind speed error measurements in the true-East direction according to an example implementation of the disclosed technology.

FIG. 7 illustrates the aggregate wind speed error measurements in the true-East direction according to an example implementation of the disclosed technology. As mentioned herein, there is a loosely standardized reporting interval for ACARS data points of 301 seconds. However, participating flights are neither required to adhere to this standard, nor are data stream interruptions re-stabilized to ensure that future hits fall in 301 second intervals. FIG. 7 shows those data points falling at the standard reporting times 710, and data points falling outside the 301 second interval and therefore excluded from the analysis 720.

The error values were then binned into histograms centered at 0 m/s, with bins 2 m/s wide, resulting in a series of histograms representing the probability of a certain forecast error occurring at discrete intervals of elapsed cruise time (multiples of 301 seconds) along flight paths between LAX and ATL. The contribution of each flight while stepping through the histograms was tracked and the transition probabilities between the bins recorded. The results of this accounting were a series of transition probability matrices forming the basis of a Markov chain.

FIGS. 8A-B illustrate two such transition matrices in the form of probability heat maps for the east and north directions, respectively, according to an example implementation of the disclosed technology. The error state at zero seconds elapsed flight time is depicted along the vertical axis, the error state at 301 seconds the horizontal axis, and the probability of transition between states is represented by the intensity of the corresponding heat map. These maps can be considered to be a series of conditional probability distributions based on an aircraft's position between LAX and ATL.

Generating the complete set of transition probability matrices provides the data required to form a complete Markov chain describing the evolution of wind forecasting uncertainty along the LAX-ATL route. Repeating this analysis on the airport pairs listed in Table 1 can provide a RUC-2 uncertainty correlation model that is location specific, real-world data driven, and usable for the long term fuel-optimal RTA problem. Moreover, one can extend the valid operating domain of the RTA algorithm by repeating this analysis on other flight tracks providing coverage for the area in which one intends to operate.

III. Example Computer System

Figure 9:
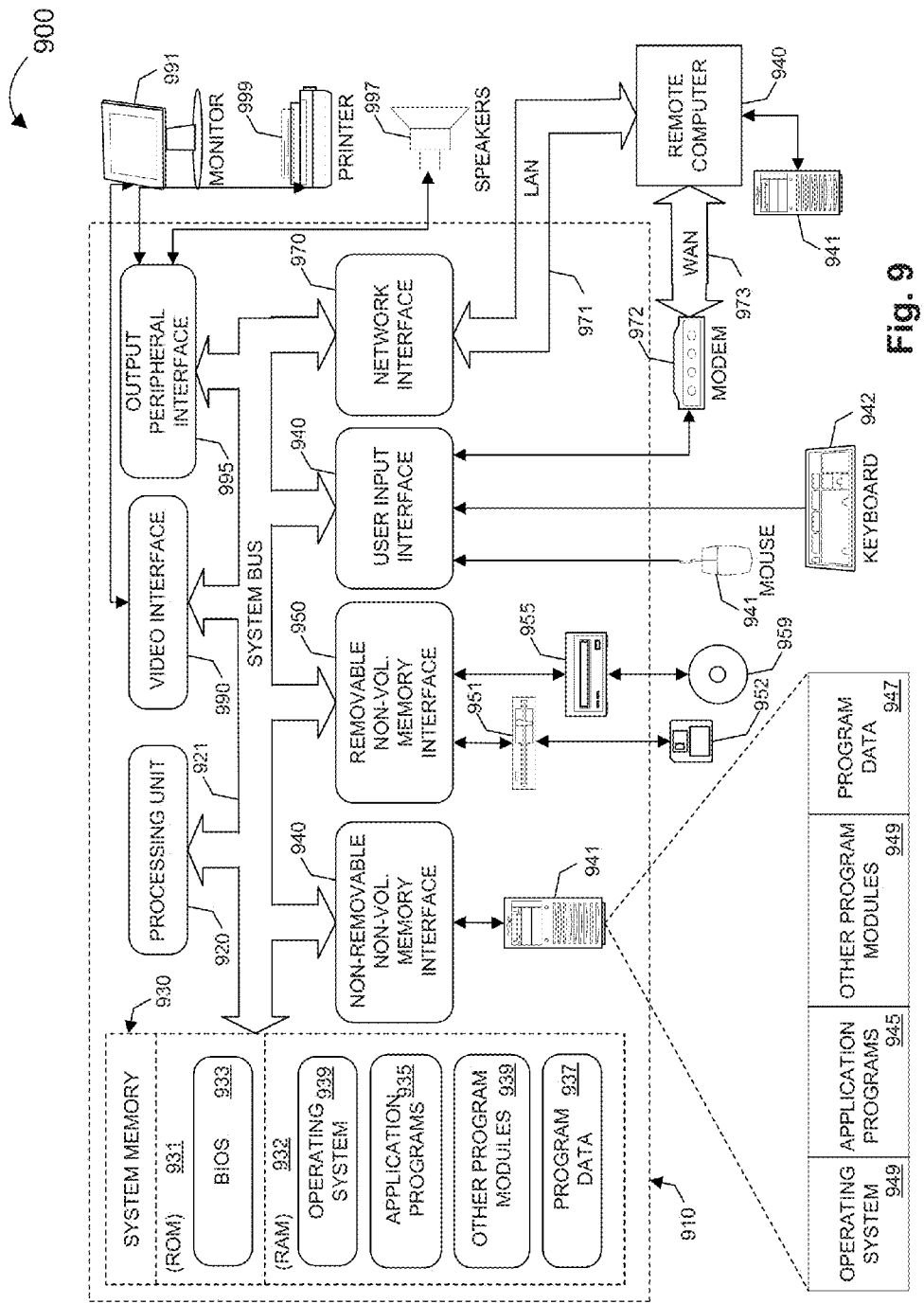
FIG. 9 illustrates an architecture of an exemplary computing device system, according to an example implementation of the disclosed technology.

FIG. 9 illustrates an architecture of a suitable target platform or device that can be used for implementation of the method for calculating an advised travel speed providing conformity to RTA with reduced fuel burn 300, or implementation of the method for modeling wind forecast uncertainty 600, according to an example implementation of the disclosed technology. One or more aspects of the disclosed methods and related systems can be embodied, in whole or in part, in a computing device 900. FIG. 9 illustrates an example of a suitable computing device 900 that can be used.

Although specific components of a computing device 900 are illustrated in FIG. 9, the depiction of these components in lieu of others does not limit the scope of the disclosed technology. Rather, various types of computing devices 900 can be used to implement embodiments of the disclosed methods. Exemplary embodiments of the disclosed method can be operational with numerous other general purpose or special purpose computing system environments or configurations.

Exemplary embodiments of the disclosed method can be described in a general context of computer-executable instructions, such as one or more applications or program modules, stored on a non-transitory computer-readable medium and executed by a computer processing unit. Generally, program modules can include routines, programs, objects, components, or data structures that perform particular tasks or implement particular abstract data types.

With reference to FIG. 9, components of the computing device 900 can comprise, without limitation, a processing unit 920 and a system memory 930. A system bus 921 can couple various system components including the system memory 930 to the processing unit 920.

The computing device 900 can include a variety of computer readable media. Computer-readable media can be any available media that can be accessed by the computing device 900, including both volatile and nonvolatile, removable and non-removable media. For example, and not limitation, computer-readable media can comprise computer storage media and communication media. Computer storage media can include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store data accessible by the computing device 900. For example, and not limitation, communication media can include wired media such as a wired network or direct-wired connection, and wireless media such as acoustic, RF, infrared and other wireless media. Combinations of any of the above can also be included within the scope of computer readable media.

The system memory 930 can comprise computer storage media in the form of volatile or nonvolatile memory such as read only memory (ROM) 931 and random access memory (RAM) 932. A basic input/output system 933 (BIOS), containing the basic routines that help to transfer information between elements within the computing device 900, such as during start-up, can typically be stored in the ROM 931. The RAM 932 typically contains data and/or program modules that are immediately accessible to and/or presently in operation by the processing unit 920. For example, and not limitation, FIG. 9 illustrates operating system 934, application programs 935, other program modules 936, and program data 937.

The computing device 900 can also include other removable or non-removable, volatile or nonvolatile computer storage media. By way of example only, FIG. 9 illustrates a hard disk drive 941 that can read from or write to non-removable, nonvolatile magnetic media, a magnetic disk drive 951 for reading or writing to a nonvolatile magnetic disk 952, and an optical disk drive 955 for reading or writing to a nonvolatile optical disk 956, such as a CD ROM or other optical media. Other computer storage media that can be used in the exemplary operating environment can include magnetic tape cassettes, flash memory cards, digital versatile disks, digital video tape, solid state RAM, solid state ROM, and the like. The hard disk drive 941 can be connected to the system bus 921 through a non-removable memory interface such as interface 940, and magnetic disk drive 951 and optical disk drive 955 are typically connected to the system bus 921 by a removable memory interface, such as interface 950.

The drives and their associated computer storage media discussed above and illustrated in FIG. 9 can provide storage of computer readable instructions, data structures, program modules and other data for the computing device 900. For example, hard disk drive 941 is illustrated as storing an operating system 944, application programs 945, other program modules 946, and program data 947. These components can either be the same as or different from operating system 934, application programs 935, other program modules 936, and program data 937.

A user of the computing device 900 can enter commands and information into the computing device 900 through input devices such as a keyboard 962 and pointing device 961, commonly referred to as a mouse, trackball, or touch pad. Other input devices (not shown) can include a microphone, joystick, game pad, satellite dish, scanner, electronic white board, or the like. These and other input devices are often connected to the processing unit 920 through a user input interface 960 coupled to the system bus 921, but can be connected by other interface and bus structures, such as a parallel port, game port, or a universal serial bus. A monitor 991 or other type of display device can also be connected to the system bus 921 via an interface, such as a video interface 990. In addition to the monitor, the computing device 900 can also include other peripheral output devices such as speakers 997 and a printer 996. These can be connected through an output peripheral interface 995.

The computing device 900 can operate in a networked environment, being in communication with one or more remote computers 980 over a network. The remote computer 980 can be a personal computer, a server, a router, a network PC, a peer device, or other common network node, and can include many or all of the elements described above relative to the computing device 900, including a memory storage device 981.

When used in a LAN networking environment, the computing device 900 can be connected to the LAN 971 through a network interface or adapter 970. When used in a WAN networking environment, the computing device 900 can include a modem 972 or other means for establishing communications over the WAN 973, such as the internet. The modem 972, which can be internal or external, can be connected to the system bus 921 via the user input interface 960 or other appropriate mechanism. In a networked environment, program modules depicted relative to the computing device 900 can be stored in the remote memory storage device. For example, and not limitation, FIG. 9 illustrates remote application programs 985 as residing on memory storage device 981. It will be appreciated that the network connections shown are exemplary and other means of establishing a communications link between computers can be used.

IV. Conclusion

Numerous characteristics and advantages have been set forth in the foregoing description, together with details of structure and function. While the disclosed technology has been disclosed in several forms, it will be apparent to those skilled in the art that many modifications, additions, and deletions, especially in matters of shape, size, and arrangement of parts, can be made therein without departing from the spirit and scope of the disclosed technology and its equivalents as set forth in the following claims. Therefore, other modifications or embodiments as may be suggested by the teachings herein are particularly reserved as they fall within the breadth and scope of the claims here appended.

What is claimed is:

1. A computer implemented method for modeling wind forecast uncertainty along a planned flight route comprising:

receiving historical flight data comprising recorded wind speeds along a planned flight route having an origin and destination;

receiving forecasted wind speeds along the planned flight route;

generating error values along the planned flight route based on comparing the recorded wind speeds and forecasted wind speeds;

dividing the planned flight route into discrete segments based on pre-defined intervals;

clustering the error values at the intervals;

preparing a histogram for each cluster of error values by binning the error values in each cluster by intensity;

generating, by a processor, a set of transition probability matrices by stepping through the histograms and recording transition probabilities between positions; and modeling, based on the comparing, wind speed uncertainty using a correlated stochastic process, wherein modeling the wind speed uncertainty comprises forming a Markov chain as a function of position along the planned flight route and the transition probabilities between the positions.

2. The method of claim 1, further comprising extracting recorded wind speeds associated with cruise segments of a flight from the historical flight data, and wherein the compared recorded wind speeds are the recorded wind speeds associated with cruise segments of a flight.

3. The method of claim 1 further comprising converting one or more of the recorded wind speeds and the forecasted wind speeds to compatible formats for comparison.

4. The method of claim 1, wherein the compared recorded wind speeds comprise recorded wind speeds from flight routes having a same origin and destination as the planned flight route.

5. The method of claim 1, wherein the intervals are based on distance.

6. The method of claim 1, wherein the intervals are based on Area Navigation (RNAV) waypoints.

7. The method of claim 1, wherein the intervals are based on time.

8. The method of claim 7, wherein the intervals are approximately 300 seconds.

9. A computer program product embodied in a non-transitory computer readable medium that stores instructions that, when executed by a processor, effectuate a method comprising:

receiving historical flight data comprising recorded wind speeds along a planned flight route having an origin and destination;

receiving forecasted wind speeds along the planned flight route;

generating error values along the planned flight route based on comparing the recorded wind speeds and forecasted wind speeds;

dividing the planned flight route into discrete segments based on pre-defined intervals;

clustering the error values at the intervals;

preparing a histogram for each cluster of error values by binning the error values in each cluster by intensity;

generating, by the processor, a set of transition probability matrices by stepping through the histograms and recording transition probabilities between positions; and modeling, based on the comparing, wind speed uncertainty using a correlated stochastic process, wherein modeling the wind speed uncertainty comprises forming a Markov chain as a function of position along the planned flight route and the transition probabilities between the positions.

10. The computer program product of claim 9, the method further comprising extracting recorded wind speeds associated with cruise segments of a flight from the historical flight data, and wherein the compared recorded wind speeds are the recorded wind speeds associated with cruise segments of a flight.

11. The computer program product of claim 9, the method further comprising converting one or more of the recorded wind speeds and the forecasted wind speeds to compatible formats for comparison.

12. The computer program product of claim 9, wherein the compared recorded wind speeds comprise recorded wind speeds from flight routes having a same origin and destination as the planned flight route.

13. The computer program product of claim 9, wherein the intervals are based on time.

14. The computer program product of claim 13, wherein the intervals are approximately 300 seconds.

15. A system comprising:

a memory operatively coupled to a processor and configured for storing data and instructions that, when executed by the processor, cause the system to perform a method comprising:

receiving historical flight data comprising recorded wind speeds along a planned flight route having an origin and destination;

receiving forecasted wind speeds along the planned flight route;

generating error values along the planned flight route based on comparing the recorded wind speeds and forecasted wind speeds;

dividing the planned flight route into discrete segments based on pre-defined intervals;

clustering the error values at the intervals;

preparing a histogram for each cluster of error values by binning the error values in each cluster by intensity;

generating, by the processor, a set of transition probability matrices by stepping through the histograms and recording transition probabilities between positions; and modeling, based on the comparing, wind speed uncertainty using a correlated stochastic process, wherein modeling the wind speed uncertainty comprises forming a Markov chain as a function of position along the planned flight route and the transition probabilities between the positions.

16. The system of claim 15, the method further comprising extracting recorded wind speeds associated with cruise segments of a flight from the historical flight data, and wherein the compared recorded wind speeds are the recorded wind speeds associated with cruise segments of a flight.

17. The system of claim 15, the method further comprising converting one or more of the recorded wind speeds and the forecasted wind speeds to compatible formats for comparison.

18. The system of claim 15, wherein the compared recorded wind speeds comprise recorded wind speeds from flight routes having a same origin and destination as the planned flight route.

19. The system of claim 15, wherein the intervals are based on distance.

20. The system of claim 15, wherein the intervals are based on Area Navigation (RNAV) waypoints.

* * * * *